(12) United States Patent
Hino et al.

(10) Patent No.: US 12,274,091 B2
(45) Date of Patent: *Apr. 8, 2025

(54) SEMICONDUCTOR INTEGRATED CIRCUIT DEVICE

(71) Applicant: SOCIONEXT INC., Kanagawa (JP)

(72) Inventors: Toshio Hino, Yokohama (JP); Junji Iwahori, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 1 day.

This patent is subject to a terminal disclaimer.

(21) Appl. No.: 18/461,371

(22) Filed: Sep. 5, 2023

(65) Prior Publication Data

US 2023/0411396 A1 Dec. 21, 2023

Related U.S. Application Data

(63) Continuation of application No. 17/838,895, filed on Jun. 13, 2022, now Pat. No. 11,784,188, which is a (Continued)

(30) Foreign Application Priority Data

Aug. 29, 2016 (JP) ................. 2016-166999

(51) Int. Cl.
*H10D 84/90* (2025.01)
*H10D 30/60* (2025.01)
(Continued)

(52) U.S. Cl.
CPC ........... *H10D 84/907* (2025.01); *H10D 30/60* (2025.01); *H10D 84/0186* (2025.01); (Continued)

(58) Field of Classification Search
CPC ....... H01L 27/11807; H01L 21/823871; H01L 21/823821; H01L 29/78; (Continued)

(56) References Cited

U.S. PATENT DOCUMENTS 5,631,492 A 5/1997 Ramus et al.
10,840,263 B2 11/2020 Hino et al.
(Continued)

FOREIGN PATENT DOCUMENTS

WO 2015/033490 A1 3/2015

OTHER PUBLICATIONS

International Search Report issued in International Patent Application No. PCT/JP2017/027524 on Oct. 17, 2017; with partial English translation.
(Continued)

*Primary Examiner* — Tucker J Wright
(74) *Attorney, Agent, or Firm* — Rimon P.C.

(57) ABSTRACT

The present disclosure attempts to provide a capacitor cell having a large capacitance value per unit area in a semiconductor integrated circuit device using a three-dimensional transistor device. A logic cell includes a three-dimensional transistor device. A capacitor cell includes a three-dimensional transistor device. A length of a portion, of a local interconnect, which protrudes from a three-dimensional diffusion layer in a direction away from a power supply interconnect in the capacitor cell is greater than a length of a portion, of a local interconnect, which protrudes from a three-dimensional diffusion layer in a direction away from a power supply interconnect in the logic cell.

5 Claims, 11 Drawing Sheets

Related U.S. Application Data continuation of application No. 17/065,875, filed on Oct. 8, 2020, now Pat. No. 11,387,256, which is a continuation of application No. 16/287,907, filed on Feb. 27, 2019, now Pat. No. 10,840,263, which is a continuation of application No. PCT/JP2017/027524, filed on Jul. 28, 2017.

(51) Int. Cl.
    *H10D 84/01*     (2025.01)
    *H10D 84/03*     (2025.01)
    *H10D 84/80*     (2025.01)
    *H10D 89/10*     (2025.01)

(52) U.S. Cl.
    CPC ....... *H10D 84/0193* (2025.01); *H10D 84/038* (2025.01); *H10D 84/811* (2025.01); *H10D 89/10* (2025.01); *H10D 84/912* (2025.01); *H10D 84/962* (2025.01); *H10D 84/966* (2025.01); *H10D 84/981* (2025.01); *H10D 84/992* (2025.01)

(58) Field of Classification Search
    CPC . H01L 2027/11812; H01L 2027/11862; H01L 2027/11866; H01L 2027/11881; H01L 2027/11892; H01L 29/775; H01L 29/0673; H01L 29/41758; H01L 29/66439; H01L 27/0924; H01L 29/78696; H01L 29/36–365
See application file for complete search history.

(56) References Cited

U.S. PATENT DOCUMENTS

| | | |
|---|---|---|
| 11,387,256 B2 | 7/2022 | Hino et al. |
| 2009/0140309 A1 | 6/2009 | Katou |
| 2016/0190138 A1 | 6/2016 | Shimbo |

OTHER PUBLICATIONS

Written Opinion of the Searching Agency, issued in International Patent Application No. PCT/JP2017/027524 on Oct. 17, 2017; with partial English translation.

Notice of Allowance issued in U.S. Appl. No. 16/287,907, dated Jul. 29, 2020.

Non-Final Office Action issued in U.S. Appl. No. 17/065,875, dated Feb. 7, 2022.

Notice of Allowance issued in U.S. Appl. No. 17/065,875, dated Apr. 26, 2022.

Non-Final Office Action issued in U.S. Appl. No. 17/838,895, dated Apr. 3, 2023.

Notice of Allowance issued in U.S. Appl. No. 17/838,895, dated Jun. 27, 2023.

FIG.5
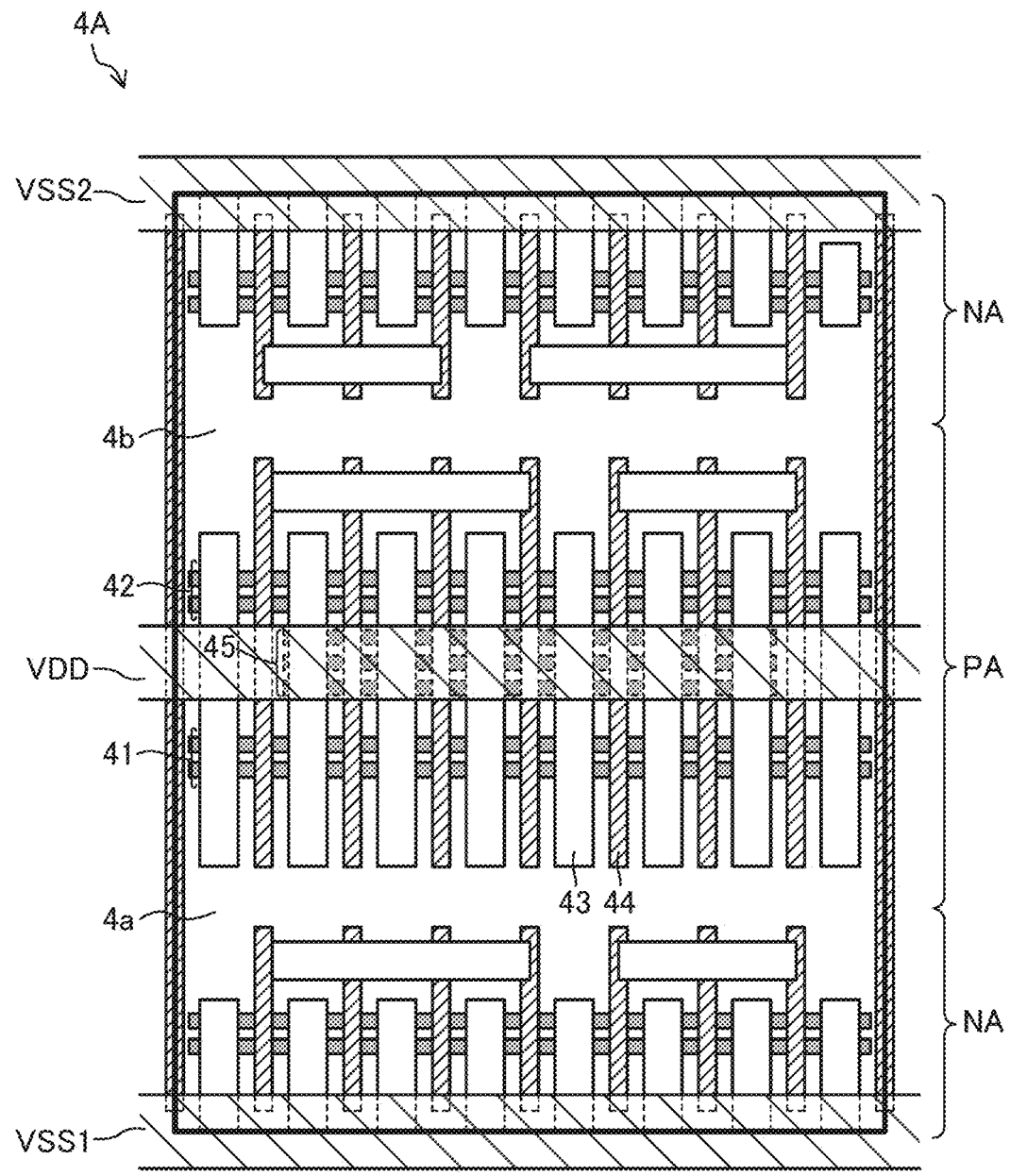
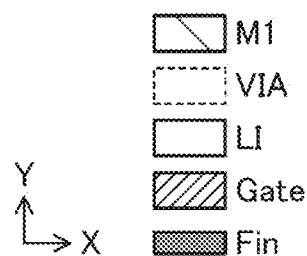

FIG.7
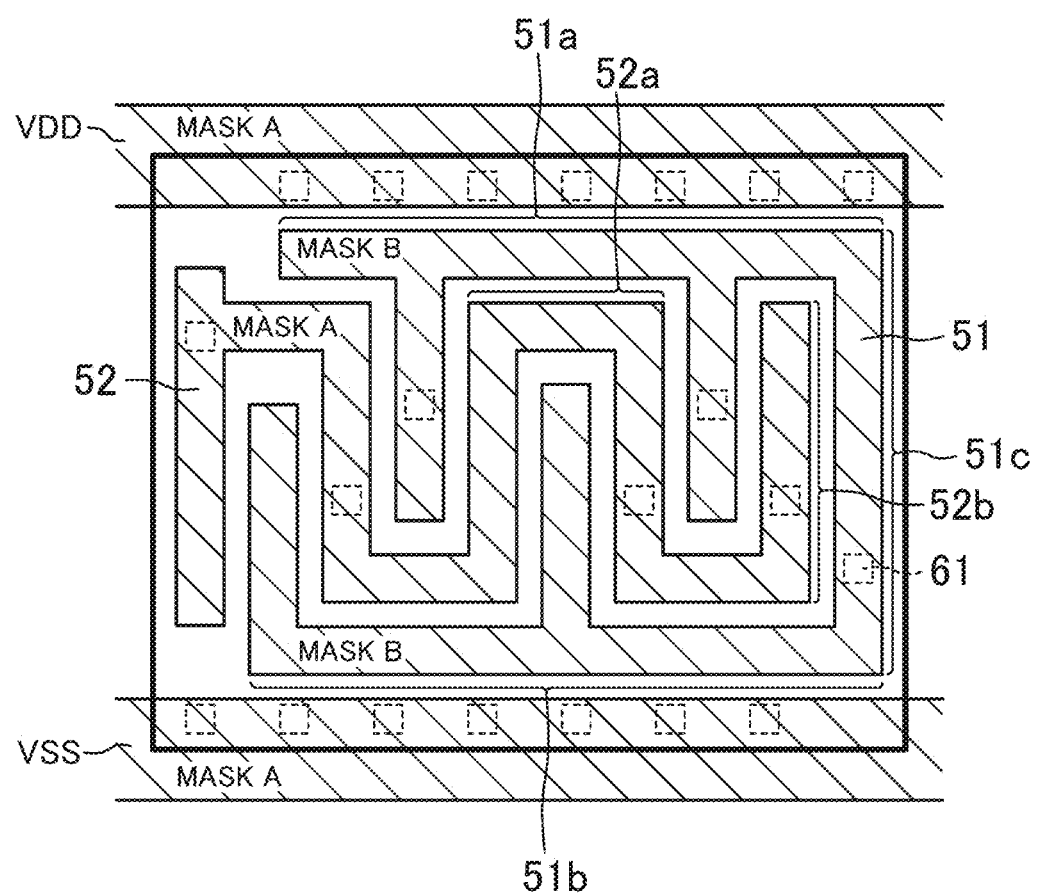
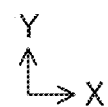

SEMICONDUCTOR INTEGRATED CIRCUIT DEVICE

CROSS-REFERENCE TO RELATED APPLICATION

This is a Continuation of U.S. patent application Ser. No. 17/838,895, filed on Jun. 13, 2022, now U.S. Pat. No. 11,784,188, which is a Continuation of U.S. patent application Ser. No. 17/065,875, filed on Oct. 8, 2020, now U.S. Pat. No. 11,387,256, which is a Continuation of U.S. patent application Ser. No. 16/287,907, filed on Feb. 27, 2019, now U.S. Pat. No. 10,840,263, which is a Continuation of International Application No. PCT/JP2017/027524 filed on Jul. 28, 2017, which in turn claims priority to Japanese Patent Application No. 2016-166999 filed on Aug. 29, 2016. The entire disclosures of these applications are incorporated by reference herein.

BACKGROUND

The present disclosure relates to a semiconductor integrated circuit device including a three-dimensional transistor device such as a fin field effect transistor (finFET) and a nanowire FET.

A standard-cell technique is a known technique to form a semiconductor integrated circuit on a semiconductor substrate. The standard-cell technique involves: previously preparing, as standard cells, basic units (e.g., an inverter, a latch, a flip flop, and a full adder) each having a specific logic function; arranging the multiple standard cells on a semiconductor substrate; and connecting the standard cells to one another via interconnects to implement an LSI chip.

In recent years, in the field of semiconductor devices, use of an FET having a fin structure (hereinafter, referred to as a finFET) has been proposed. FIG. 10 is a schematic diagram showing an outline of a finFET. Unlike a two-dimensional FET, a source and a drain have a raised three dimensional structure called a fin. A gate is provided so as to surround the fin. This fin structure allows the channel region to be formed of three faces of the fin, contributing to significant improve of the controllability of the channel as compared with conventional two-dimensional FETs. These features make it possible to obtain effects such as reduction in leakage power, improvement in on-current, and, further, reduction in operating voltage, contributing to improvement of the performance of the semiconductor integrated circuit. Note that the finFET is a kind of so-called three-dimensional transistor device having a three-dimensional diffusion layer. Another example of the three-dimensional transistor device is implemented in a structure called nanowire FET.

In recent years, progress in miniaturization and high integration of semiconductor integrated circuits has been remarkably advanced, and accordingly, the operating voltage is further decreasing and the operating frequency is further increasing in speed. However, the high speed frequency causes an increase in noise and the low operating voltage causes a decrease in noise resistance. Hence, recent semiconductor integrated circuits tend to malfunction due to the noise. As a technique of reducing the malfunction of the circuit due to noise, a decoupling capacitor is provided between the power sources of the circuit. A cell in which such decoupling capacitor is formed is referred to as a capacitor cell.

U.S. Pat. No. 5,631,492 (FIGS. 3 and 4) shows an example of a layout configuration of a capacitor cell.

SUMMARY

To mount a three-dimensional transistor device, a local interconnect is typically used. The local interconnect is an interconnect provided to make direct contact with a diffusion layer and a gate of a transistor without through a contact.

In addition, a technique called double patterning is used to form metal interconnects for a three-dimensional transistor device. The double patterning is a technique in which a layout of interconnects is divided into two or more masks to perform exposure. Two adjacent interconnects are each exposed using different masks, contributing to narrowing the intervals of the interconnects.

In a semiconductor integrated circuit device using such a local interconnect and double patterning, one of the issues is how to implement a capacitor cell having a large capacitance value per unit area.

The present disclosure implements a capacitor cell having a large capacitance value per unit area in a semiconductor integrated circuit device including a three-dimensional transistor device such as a finFET and a nanowire FET.

A first aspect of the present disclosure is directed to a semiconductor integrated circuit device. The semiconductor integrated circuit device includes: a first standard cell including a three-dimensional transistor device, the first standard cell being a logic cell; and a second standard cell including a three-dimensional transistor device, the second standard cell being a capacitor cell. The first standard cell includes: a first three-dimensional diffusion layer extending in a first direction, the first three-dimensional diffusion layer being one three-dimensional diffusion layer or a plurality of three-dimensional diffusion layers arranged in a second direction perpendicular to the first direction; and a first local interconnect extending in the second direction, and connecting the first three-dimensional diffusion layer and a power supply interconnect together, the power supply interconnect extending in the first direction and supplying a predetermined first power supply voltage. The second standard cell includes: a second three-dimensional diffusion layer extending in the first direction, the second three-dimensional diffusion layer being one three-dimensional diffusion layer or a plurality of three-dimensional diffusion layers arranged in the second direction; a second local interconnect extending in the second direction and connecting the second three-dimensional diffusion layer and the power supply interconnect together; and a gate interconnect extending in the second direction so as to intersect with the second three-dimensional diffusion layer in plan view, surrounding the second three-dimensional diffusion layer, and provided with a predetermined second power supply voltage. A length of a portion, of the second local interconnect, which protrudes from the second three-dimensional diffusion layer in a direction away from the power supply interconnect in the second standard cell is greater than a length of a portion, of the first local interconnect, which protrudes from the first three-dimensional diffusion layer in a direction away from the power supply interconnect in the first standard cell.

According to this aspect, the length of a portion, of the local interconnect, which protrudes from the three-dimensional diffusion layer in a direction away from the power supply interconnect in the second standard cell that is the capacitor cell is greater than the length of a portion, of the local interconnect, which protrudes from the three-dimensional diffusion layer in a direction away from the power supply interconnect in the first standard cell that is the logic cell. In other words, in the capacitor cell, the local interconnect connected to the three-dimensional diffusion layer of the three-dimensional transistor device has a long portion extending from the three-dimensional diffusion layer. This feature increases the parasitic capacitance between the local interconnect and the gate interconnect, so that a capacitor cell having a large capacitance value per unit area can be implemented.

A second aspect of the present disclosure is directed to a semiconductor integrated circuit device including a standard cell which is a capacitor cell. The standard cell includes: a first power supply interconnect extending in a first direction and supplying a first power supply voltage; a second power supply interconnect extending in the first direction and supplying a second power supply voltage; a capacitor provided between the first power supply interconnect and the second power supply interconnect, and including a three-dimensional transistor device; a first interconnect supplying the second power supply voltage to the capacitor; and a second interconnect supplying the first power supply voltage to the capacitor. The first and second power supply interconnects and the first and second interconnects are provided in a same metal interconnect layer. The first interconnect includes: a first portion extending in the first direction and adjacent to the first power supply interconnect; a second portion extending in the first direction and adjacent to the second power supply interconnect; and a third portion extending in a second direction perpendicular to the first direction and connecting the first portion and the second portion together.

According to this aspect, in the standard cell that is the capacitor cell, the capacitor including the three-dimensional transistor device is provided between the first power supply interconnect and the second power supply interconnect. The first interconnect supplying the power supply voltage to the capacitor includes: the first portion extending in the first direction and adjacent to the first power supply interconnect; the second portion extending in the first direction and adjacent to the second power supply interconnect; and the third portion extending in the second direction perpendicular to the first direction and connecting the first portion and the second portion together. According to these features, in the double patterning, the first and second power supply interconnects and the first interconnect including the first and second portions respectively adjacent to the first and second power supply interconnects can be formed with different masks. Therefore, the first interconnect can be provided at extremely small intervals with respect to the first and second power supply interconnects. Thus, a capacitor cell having a large capacitance value per unit area can be implemented.

In a semiconductor integrated circuit device using a three-dimensional transistor device, the present disclosure makes it possible to implement a capacitor cell having a large capacitance value per unit area. Therefore, the present disclosure can improve the performance of the semiconductor integrated circuit device.

BRIEF DESCRIPTION OF THE DRAWINGS

FIG. 5 is a plan view showing a modification of the capacitor cell.

FIG. 7 is a diagram showing metal interconnects extracted from the layout configuration shown in FIG. 6.

DETAILED DESCRIPTION

Embodiments will be described in detail with reference to the drawings. In the following embodiments, a semiconductor integrated circuit device includes multiple standard cells, and at least some of the standard cells include a fin field effect transistor (finFET). Note that the finFET is an example of a three-dimensional transistor device, and a fin included in the finFET is an example of a three-dimensional diffusion layer.

First Embodiment

Figure 1:
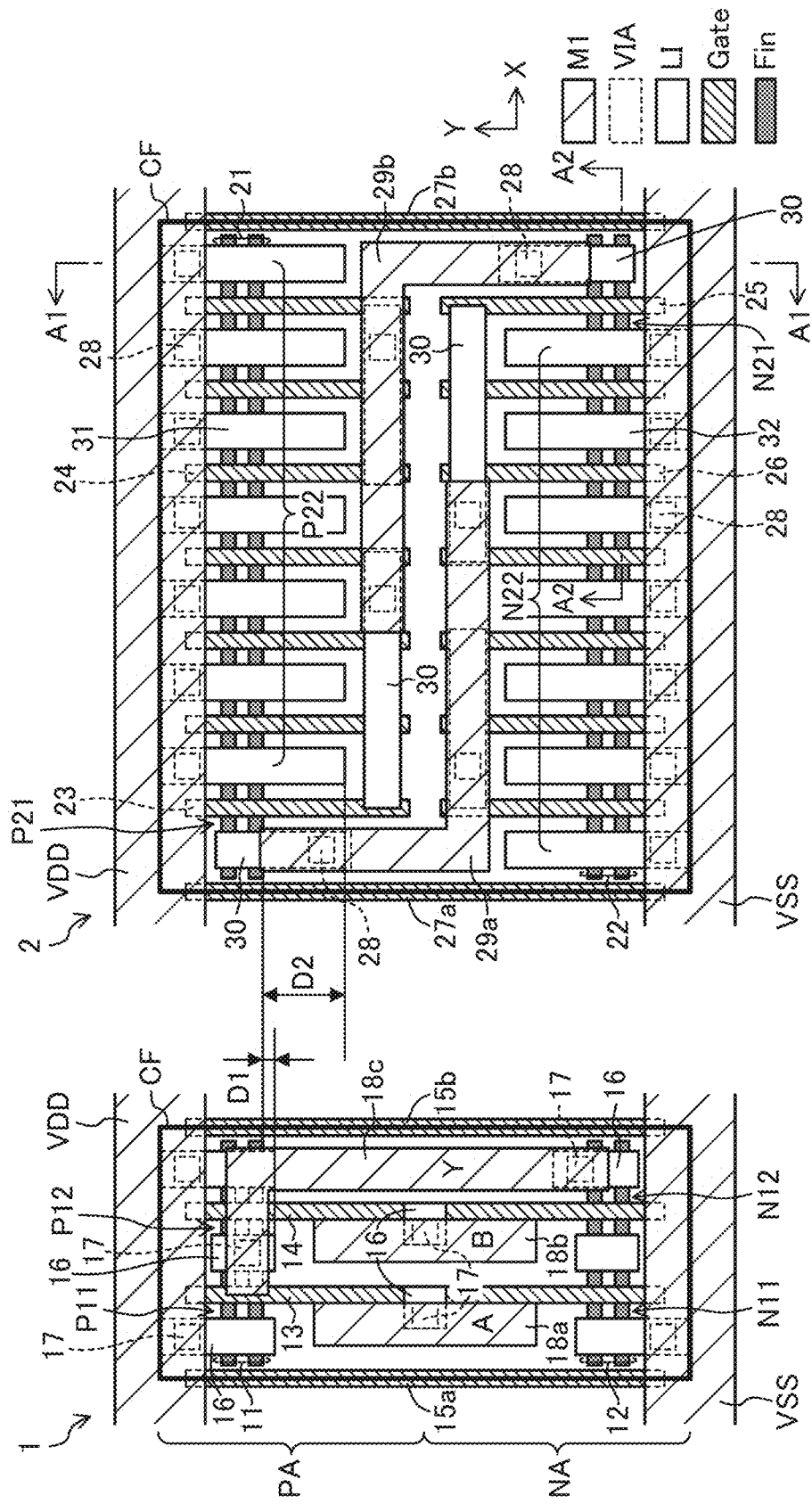
FIG. 1 is a plan view showing an example of a layout configuration of standard cells included in a semiconductor integrated circuit device according to a first embodiment.
Figure 2A:
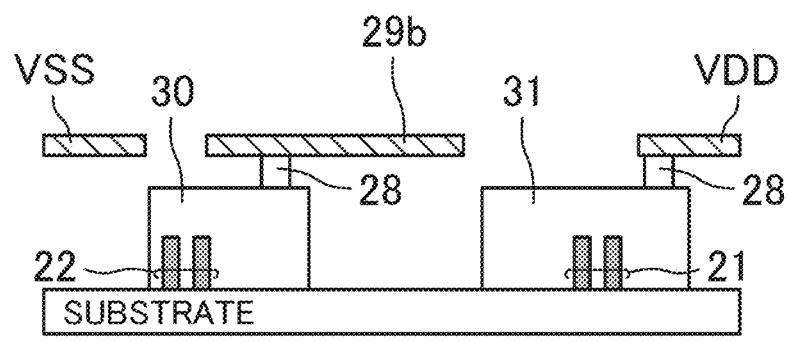
FIG. 2A is a cross-sectional view of the configuration shown in FIG. 1.
Figure 2B:
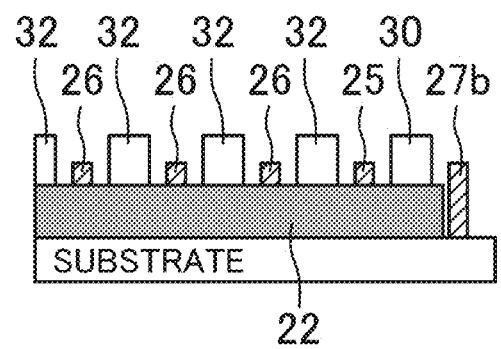
FIG. 2B is a cross-sectional view of the configuration shown in FIG. 1.

FIG. 1 is a plan view showing an example of a layout configuration of standard cells included in a semiconductor integrated circuit device according to a first embodiment. In FIG. 1, the horizontal direction of the drawing is defined as an X direction (corresponding to a first direction), and the vertical direction of the drawing is defined as a Y direction (corresponding to a second direction). The same applies to the subsequent layout plan views. In FIG. 1, standard cells 1 and 2 are arranged in the same cell row extending in the X direction. The reference character "CF" denotes a cell frame. Furthermore, FIG. 2A is a cross-sectional view taken along line A1-A1 of FIG. 1, and FIG. 2B is a cross-sectional view taken along line A2-A2 of FIG. 1.

Figure 3A:
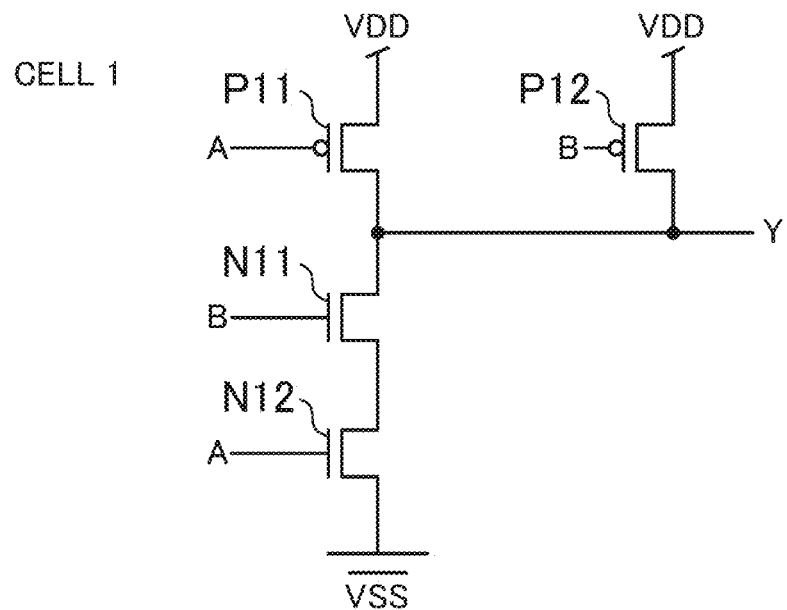
FIG. 3A is a circuit diagram of the standard cell shown in FIG. 1.
Figure 3B:
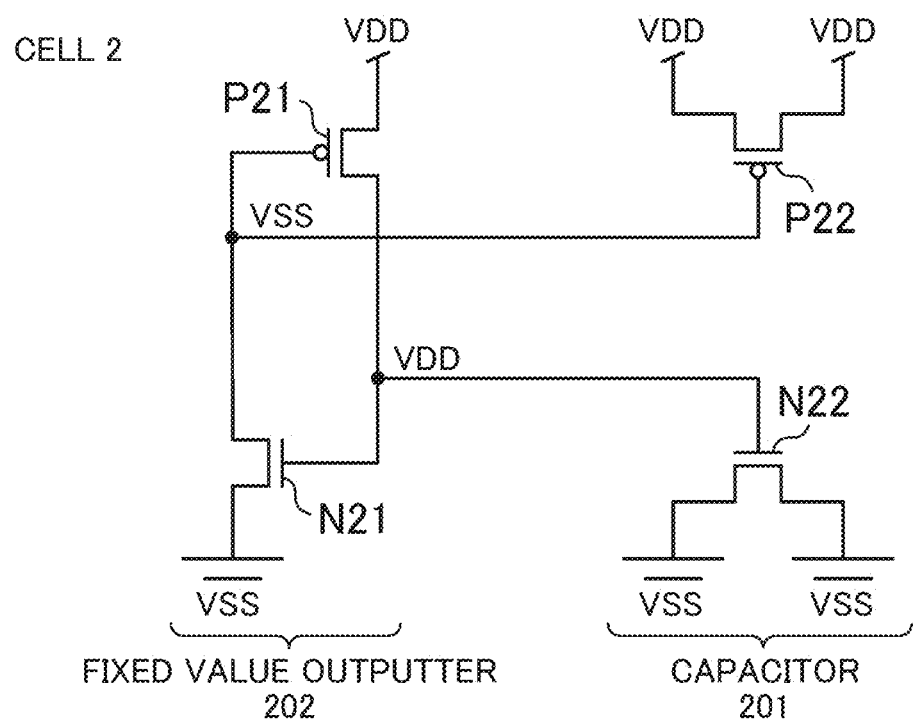
FIG. 3B is a circuit diagram of the standard cell shown in FIG. 1.

FIG. 3A is a circuit diagram showing the circuit configuration of the standard cell 1, and FIG. 3B is a circuit diagram showing circuit configuration of the standard cell 2. As shown in FIG. 3A, the standard cell 1 constitutes a two-input NAND circuit. The standard cell 1 is an example of a logic cell which contributes to the logic function of the circuit. As shown in FIG. 3B, the standard cell 2 is included in a capacitor cell (a decoupling capacitor cell). This capacitor cell includes: a capacitor 201 having a transistor forming a capacitance; and a fixed value outputter 202 outputting a fixed value (VDD, VSS) to be supplied to a gate of the transistor included in the capacitor 201. Each of the standard cells 1 and 2 includes finFETs.

In FIG. 1, power supply interconnects VDD and VSS extending in the X direction are formed in a metal interconnect layer M1. In the standard cells 1 and 2, a P-type transistor region PA and an N-type transistor region NA are arranged in the Y direction between the power supply interconnect VDD and the power supply interconnect VSS. The standard cell 1 includes two fins 11 extending in the X direction in the P-type transistor region PA, and two fins 12 extending in the X direction in the N-type transistor region NA. The standard cell 2 includes two fins 21 extending in the X direction in the P-type transistor region PA, and two fins 22 extending in the X direction in the N-type transistor region NA. In FIG. 1 and other plan views, the fins and a gate interconnect formed on the fins constitute the finFETs. The gate interconnect surrounds the fin from three directions. Note that in FIG. 1 and other plan views, the fins are colored gray to be identified easily.

Furthermore, a local interconnect is provided in an interconnect layer LI which is in direct contact with a fin layer. The local interconnect is in contact with the fins or an upper layer of the gate interconnect, in a portion thereof overlapping with the fins or the gate interconnect in a plan view. The local interconnect is electrically connected to the fins or the gate interconnect. A metal interconnect is located above the local interconnect and is connected to the local interconnect via the contact.

The standard cell 1 includes gate interconnects 13 and 14 extending in the Y direction across the P-type transistor region PA and the N-type transistor region NA. The fins 11 and the gate interconnect 13 constitute a finFET P11, and the fins 11 and the gate interconnect 14 constitute a finFET P12. The fins 12 and the gate interconnect 13 constitute a finFET N11, and the fins 12 and the gate interconnect 14 constitute a finFET N12. Moreover, reference characters 15a and 15b denote dummy gate interconnects. Local interconnects 16 are respectively provided at both ends of each of the fins 11 and 12 are between the gate interconnects 13 and 14. The local interconnects 16 extend in the Y direction. Both ends of each of the fins 11 are connected to the power supply interconnect VDD via the local interconnects 16 and contacts 17. One end (the left end in the drawing) of each of the fins 12 is connected to the power supply interconnect VSS via the local interconnect 16 and a contact 17. The gate interconnect 13 is connected to a metal interconnect 18a which is provided with an input A, via the local interconnect 16 and the contact 17. The gate interconnect 14 is connected to a metal interconnect 18b which is provided with an input B, via the local interconnect 16 and the contact 17. A metal interconnect 18c for outputting an output Y is connected, via the local interconnect 16 and the contact 17, to the fins 11 between the gate interconnects 13 and 14 and the other end (the right end in the drawing) of each of the fins 12.

The standard cell 2 includes: gate interconnects 23 and 24 extending in the Y direction in the P-type transistor region PA; and gate interconnects 25 and 26 extending in the Y direction in the N-type transistor region NA. The fins 21 and the gate interconnect 23 constitute a finFET P21, and the fins 21 and the gate interconnects 24 constitute a finFET P22. Here, six gate interconnects 24 are arranged, and the finFET P22 includes six finFETs. A source and a drain of each of the six finFETs are connected to the power supply interconnect VDD via an associated one of local interconnects 31 extending in the Y direction and an associated one of contacts 28. The fins 22 and the gate interconnect 25 constitute a finFET N21, and the fins 22 and the gate interconnects 26 constitute a finFET N22. Here, six gate interconnects 26 are arranged, and the finFET N22 includes six finFETs. A source and a drain of each of the six finFETs are connected to the power supply interconnect VSS via an associated one of local interconnects 32 extending in the Y direction and an associated one of contacts 28. As shown in FIG. 3B, the finFETs P22 and N22 constitute a capacitor 201, and the finFETs P21 and N21 constitute the fixed value outputter 202. Furthermore, reference characters 27a and 27b denote dummy gate interconnects.

One end (the left end in the drawing) of each of the fins 21 is connected to a metal interconnect 29a via a local interconnect 30 extending in the Y direction and a contact 28. The metal interconnect 29a is connected to the gate interconnects 25 and 26 via a local interconnect 30 extending in the X direction and a contact 28. One end (the right end in the drawing) of each of the fins 22 is connected to a metal interconnect 29b via a local interconnect 30 extending in the Y direction and a contact 28. The metal interconnect 29b is connected to the gate interconnects 23 and 24 via a local interconnect 30 extending in the X direction and a contact 28.

Here, attention is paid to the local interconnects connecting the fins and the power supply interconnects to each other.

In the P-type transistor region PA of the standard cell 2, local interconnects 31 that connect the power supply interconnect VDD to the finFET P22 included in the capacitor 201 extend from the power supply interconnect VDD and are long enough to cross the fins 21 to reach an inward portion of the cell. In other words, a length (protruding length) D2 of a portion, of the local interconnect 31, which protrudes from the fin 21 in a direction away from the power supply interconnect VDD is larger than a length (protruding length) D1 of a portion, of the local interconnect 16, which protrudes from the fin 11 in a direction away from the power supply interconnect VDD in the P-type transistor region PA of the standard cell 1. Similarly, in the N-type transistor region NA of the standard cell 2, local interconnects 32 that connect the power supply interconnect VSS to the finFET N22 included in the capacitor 201 extend from the power supply interconnect VSS and are long enough to cross the fins 22 to reach an inward portion of the cell.

In a conventional standard cell, a length of a local interconnect is set to a minimum in order to curb an increase in parasitic capacitance. For example, a protruding length D1 of the local interconnect 16 in the standard cell 1 would be preferably set to a minimum value allowed in the manufacturing process. In contrast, in this embodiment, in the standard cell 2 that is a capacitor cell, the local interconnects 31 and 32 are long enough to cross the fins 21 and 22 so as to extend toward an inward portion of the cell for the purpose of increasing parasitic capacitance. Designing the local interconnects 31 and 32 to have such a long length makes the parasitic capacitance between the local interconnects 31, 32 and the gate interconnects 24, 26 larger. The larger parasitic capacitance makes it possible to increase the capacitance value of the capacitor 201. Such features can implement a capacitor cell having a large capacitance value per unit area; that is, the standard cell 2.

In the configuration shown in FIG. 1, the fins 11 of the standard cell 1 and the fins 21 of the standard cell 2 are the same in number and in position in relation to the Y direction. However, the present disclosure is not limited to this number and this position. Alternatively, the fins 11 and 21 may be different in number and in position in relation to the Y direction. In any case, the length of a portion, of each local interconnect, which protrudes from an end, of the respective fin, facing the center of the cell may be compared as the protruding length.

In addition, in the configuration of FIG. 1, the standard cells 1 and 2 are arranged in the same cell row extending in the X direction; however, the present disclosure is not limited to such an arrangement. The standard cells 1 and 2 may be arranged in different cell rows.

Modifications

In FIG. 1, the standard cell 2, which is a capacitor cell, is assumed to be a so-called single-height cell. However, the capacitor cell according to the present embodiment can also be configured as a so-called multi-height cell.

Figure 4:
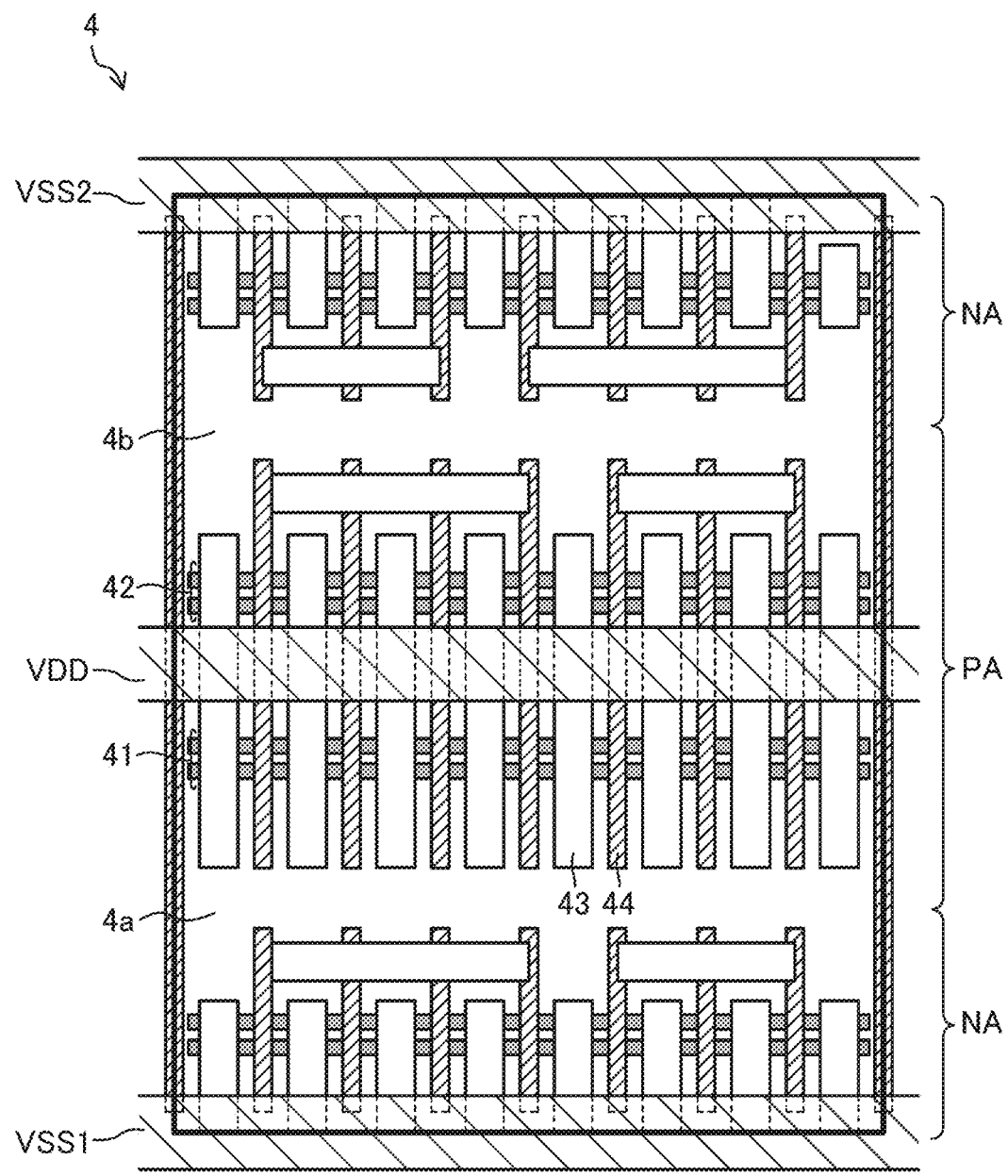
FIG. 4 is a plan view showing a modification of a capacitor cell.

FIGS. 4 and 5 are plan views showing modifications of the capacitor cell according to this embodiment. A capacitor cell 4 shown in FIG. 4 and a capacitor cell 4A shown in FIG. 5 are double-height cells. Each of the capacitor cells 4 and 4A includes: power supply interconnects VSS1 and VSS2, each arranged at a different end in the Y direction to extend in the X direction, for supplying a power supply potential VSS; and a power supply interconnect VDD, provided in the middle in relation to the Y direction to extend in the X direction, for supplying a power supply potential VDD. The P-type transistor region PA is provided on both sides of the power supply interconnect VDD in the Y direction. Note that in FIGS. 4 and 5, the contacts and the metal interconnects other than the power supply interconnects are omitted. Furthermore, in FIG. 5, for the sake of easy comprehension, portions of the fins arranged under the metal interconnects are colored gray to show that no local interconnect or gate interconnect is provided above the portions.

The capacitor cell 4 shown in FIG. 4 has the same features as those of the standard cell 2 shown in FIG. 1. For example, in a region 4a, a local interconnect 43 extends in the Y direction away from the power supply interconnect VDD to have a long portion protruding from the fins 41 extending in the X direction. Furthermore, fins 42 extending in the X direction are provided on an opposite side of the power supply interconnect VDD from the fins 41. In other words, the fins 42 are formed in the P-type transistor region PA of the region 4b. The local interconnect 43 is integrally formed and passes under the power supply interconnect VDD from the P-type transistor region PA of the region 4a. The local interconnect 43 is also connected to the fins 42. The gate interconnect 44 passes under the power supply interconnect VDD and extends in the Y direction so as to intersect with each of the fins 41 and 42 in a plan view. The gate interconnect 44 is surrounds the fins 41 and 42. The fins 41 and the gate interconnect 44 constitute a finFET, and the fins 42 and the gate interconnect 44 constitute a finFET. The configuration shown in FIG. 4 further increases the parasitic capacitance between the local interconnect 43 and the gate interconnect 44, allowing the capacitor cell 4 to have a large capacitance value. In FIG. 4, two fins 41 and two fins 42 are provided. However, the number of fins to be formed on both sides of the power supply interconnect VDD is not limited to two.

The capacitor cell 4A shown in FIG. 5 has a basic configuration similar to that of the capacitor cell 4 shown in FIG. 4. The capacitor cell 4A further includes fins 45 extending in the X direction under the power supply interconnect VDD. The gate interconnect 44 surrounds the fins 45. The fins 45 and gate interconnect 44 constitute a finFET. Thus, the configuration shown in FIG. 5 further increases the gate capacitance of the finFET, allowing the capacitor cell 4A to have a further larger capacitance value. In FIG. 5, three fins 45 are provided. However, the number of fins to be formed under the power supply interconnect VDD is not limited to three.

In FIGS. 4 and 5, the power supply interconnect VDD is provided in the middle of the capacitor cell in relation to the Y direction. Alternatively, the power supply interconnect VSS may be provided in the middle of the capacitor cell in relation to the Y direction. In this case, power supply interconnects supplying the power supply potential VDD are arranged on both ends of the capacitor cell in the Y direction. The N-type transistor region is then provided on both sides of the power supply interconnect VSS in the Y direction. Furthermore, the capacitor cell may be configured as a multi-height cell having a height greater than a double-height cell.

Second Embodiment

Figure 6:
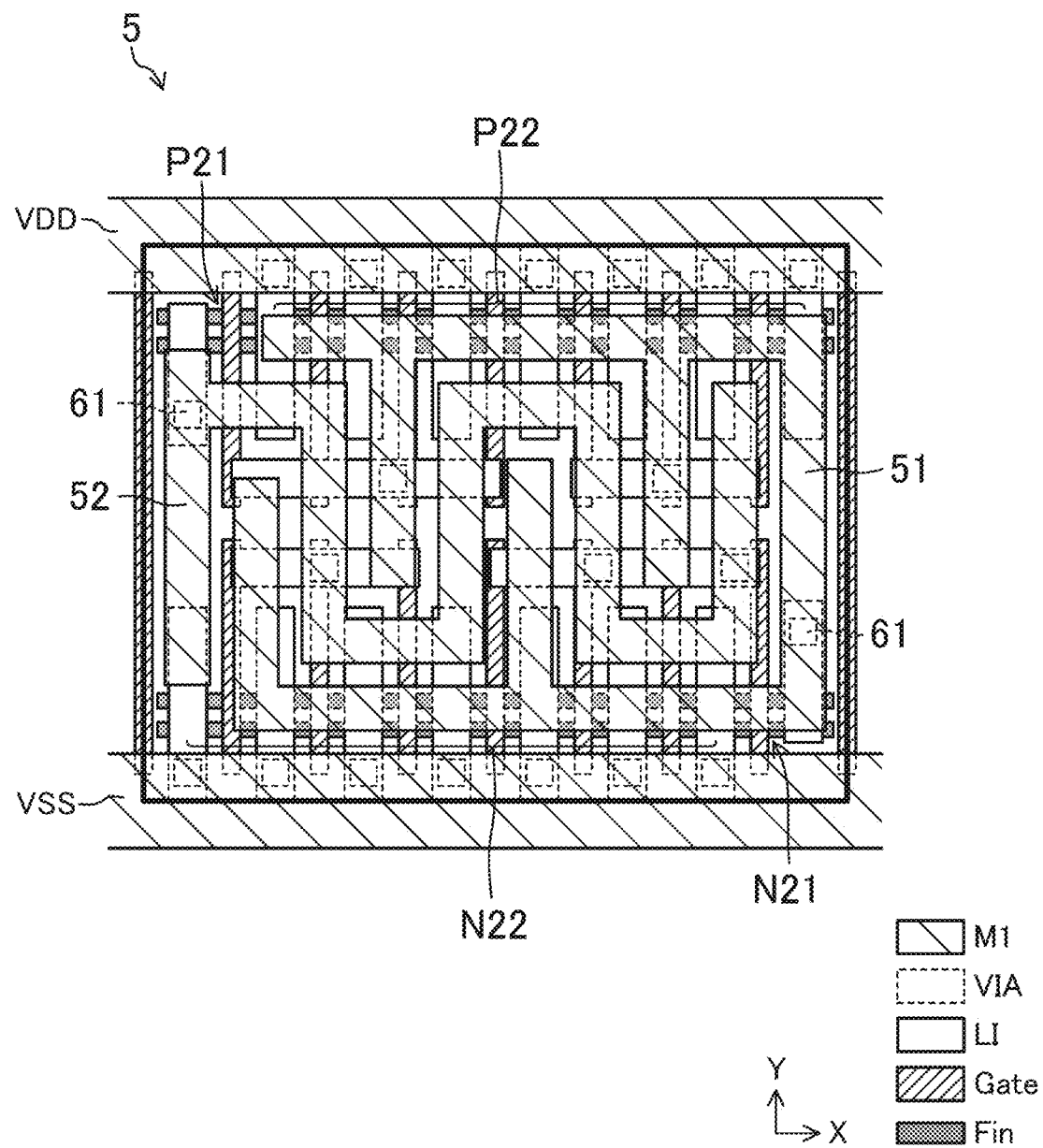
FIG. 6 is a plan view showing an example of a layout configuration of a standard cell included in a semiconductor integrated circuit device according to a second embodiment.

FIG. 6 is a plan view showing an example of a layout configuration of a standard cell included in a semiconductor integrated circuit device according to a second embodiment. A standard cell 5 shown in FIG. 6 is a capacitor cell. The configuration of the standard cell other than the metal interconnects 51 and 52 and the contact 61 (e.g., the arrangement of the fins and the gate interconnects, and the connection relationship among the elements) is the same as that of the standard cell 2 of FIG. 1. In FIG. 5, for the sake of easy comprehension, portions of the fins arranged under metal interconnects are colored gray to show that no local interconnect or gate interconnect is provided above the portions. As shown in the circuit diagram in FIG. 3B, the finFETs P21 and N21 constitute the fixed value outputter 202, and the finFETs P22 and N22 constitute the capacitor 201. The metal interconnect 51 is connected to the drain of the finFET N21 included in the fixed value outputter 202, and supplies a voltage VSS to the gate of the finFET P22 included in the capacitor 201. The metal interconnect 52 is connected to the drain of the finFET P21 included in the fixed value outputter 202, and supplies a voltage VDD to the gate of the finFET N22 included in the capacitor 201.

In the configuration shown in FIG. 6, the metal interconnects 51 and 52 connected to the local interconnect are arranged more densely than the metal interconnects in the configuration of FIG. 1. Thus, the parasitic capacitance between the metal interconnects 51 and 52 is further increased.

FIG. 7 is a diagram showing metal interconnects extracted from the layout shown in FIG. 6. As shown in FIG. 7, the metal interconnect provided closest to both the power supply interconnect VDD and the power supply interconnect VSS is the metal interconnect 51. Specifically, the metal interconnect 51 as a first interconnect includes: a portion 51a extending in the X direction and adjacent to the power supply interconnect VDD; a portion 51b extending in the X direction and adjacent to the power supply interconnect VSS; and a portion 51c extending in the Y direction and connecting the portion 51a and the portion 51b to each other. In the metal interconnect layer M1, the portion 51a is the interconnect closest to the power supply interconnect VDD, and the portion 51b is the interconnect closest to the power supply interconnect VSS. The metal interconnect 52 is provided so as to meander in a region sandwiched between the portion 51a and the portion 51b of the metal interconnect 51. Specifically, the metal interconnect 52 as a second interconnect includes: a portion 52a extending in the X direction and arranged on an opposite side of the portion 51a of the metal interconnect 51 from the power supply interconnect VDD, the portion 52a and the portion 51a of the metal interconnect 51 being adjacent to each other; and a portion 52b extending in the Y direction. Furthermore, the interconnect intervals may be equal to each other. For example, an interval between the portion 51a of the metal interconnect 51 and the power supply interconnect VDD, and an interval between the portion 51a of the metal interconnect 51 and the portion 52a of the metal interconnect 52 may be equal to each other.

Here, the power supply interconnects VDD and VSS and the metal interconnects 51 and 52 are formed in the same interconnect layer by, for example, the double patterning described above. In order to further increase the parasitic capacitance between the metal interconnects 51 and 52, the metal interconnects 51 and 52 may suitably be arranged at short intervals. Hence, a desirable layout structure for the metal interconnects 51 and 52 is one which allows exposure to be appropriately performed using two or more masks in the double patterning and of which the interconnect intervals are shorter.

As shown in FIG. 7, the power supply interconnects VDD and VSS are usually formed with the same mask (MASK A) in the double patterning. For this reason, in the present embodiment, the metal interconnect closest to the power supply interconnects VDD and the metal interconnect closest to the power supply interconnect VSS are both implemented as the metal interconnect 51, as shown in FIG. 7. Therefore, the metal interconnect 51, which is closest to the power supply interconnects VDD and VSS, can be formed with a mask (MASK B) different from the mask for the power supply interconnects VDD and VSS. Thus, the metal interconnect 51 can be provided at extremely short intervals to the power supply interconnects VDD and VSS. Furthermore, forming the metal interconnect 52 and the power supply interconnects VDD and VSS with the same mask (MASK A) makes it possible to arrange the metal interconnects 51 and 52 more densely at small intervals. In other words, adoption of the interconnect shape of FIG. 7 makes it possible to appropriately perform exposure using two or more masks in the double patterning and to further reduce the interconnect intervals. This feature allows the capacitor cell 5 to have a large capacitance value per unit area.

Figure 8:
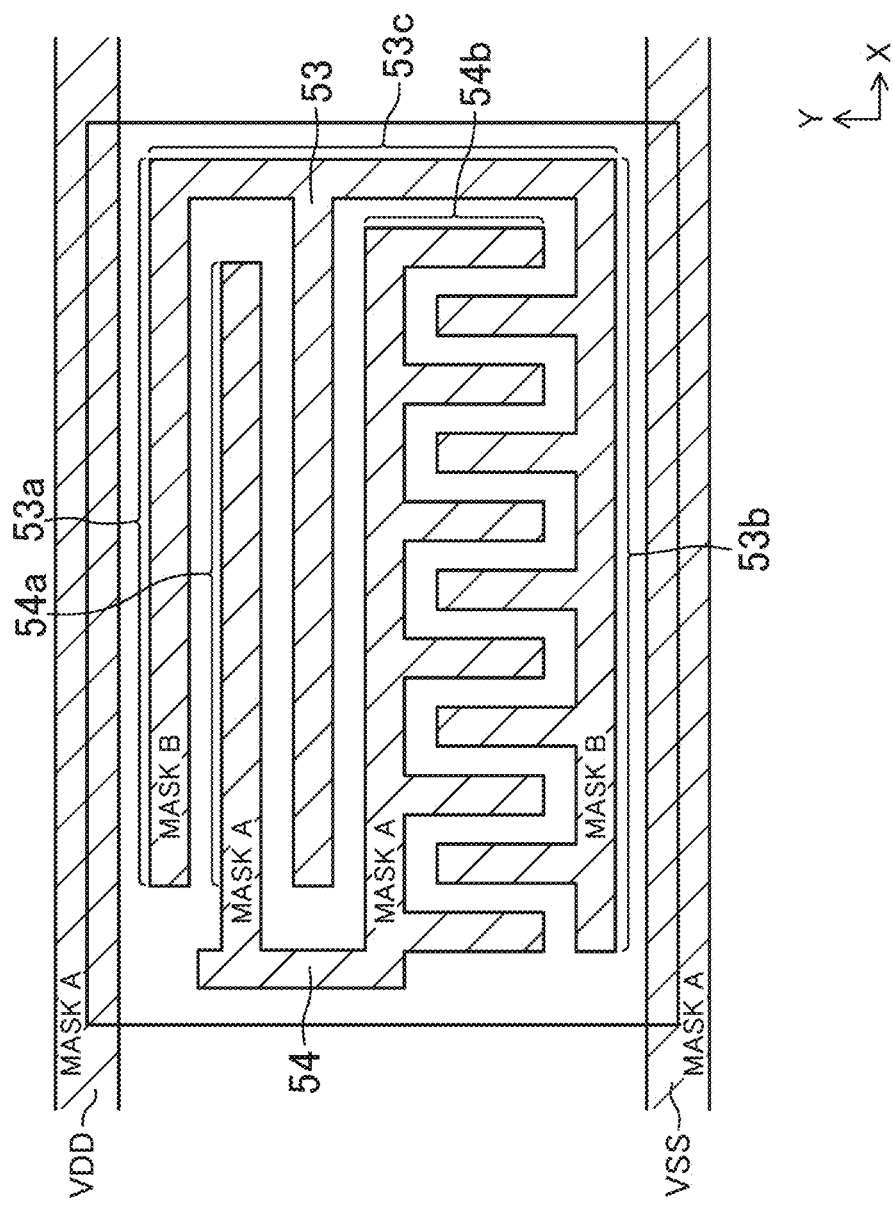
FIG. 8 is another example of a shape of a metal interconnect in the second embodiment.
Figure 9:
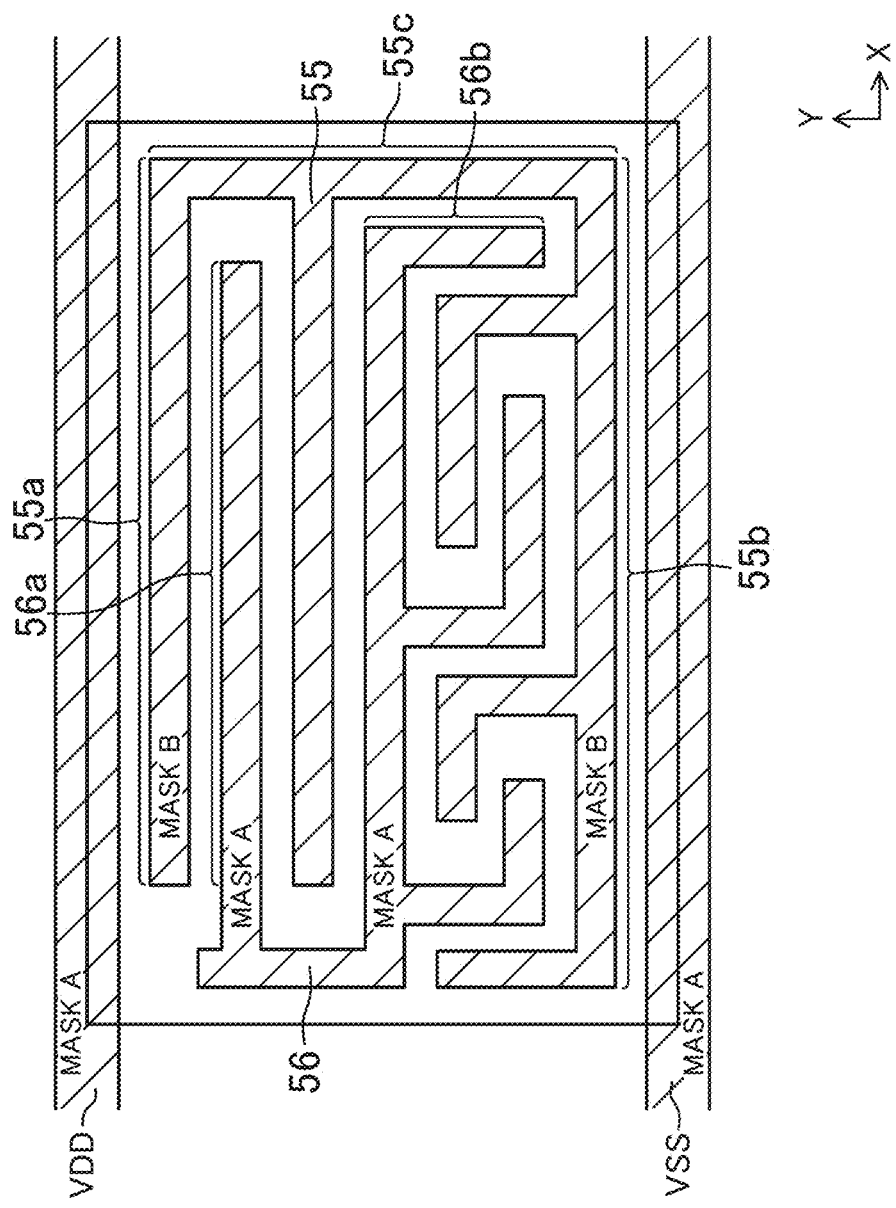
FIG. 9 is still another example of a shape of a metal interconnect in the second embodiment.
Figure 10:
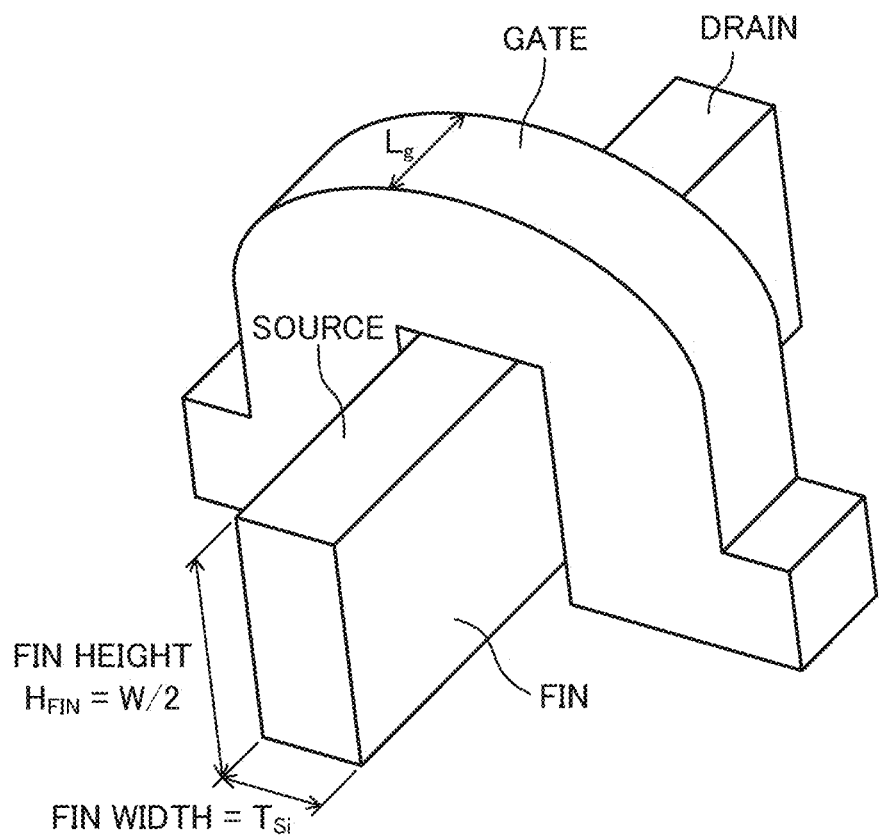
FIG. 10 is a schematic diagram showing a general structure of a finFET.

FIGS. 8 and 9 show another example of the shape of the metal interconnect in this embodiment. In the example of FIG. 8, a metal interconnect 53 (MASK B) as the first interconnect supplying the voltage VSS includes: a portion 53a extending in the X direction and adjacent to the power supply interconnect VDD; a portion 53b extending in the X direction and adjacent to the power supply interconnect VSS; and a portion 53c extending in the Y direction and connecting the portion 53a and the portion 53b to each other. In the metal interconnect layer M1, the portion 53a is the interconnect closest to the power supply interconnect VDD, and the portion 53b is the interconnect closest to the power supply interconnect VSS. Furthermore, a metal interconnect 54 (MASK A) as the second interconnect supplying the voltage VDD includes: a portion 54a extending in the X direction and arranged on an opposite side of the portion 53a of the metal interconnect 53 from the power supply interconnect VDD, the portion 54a and the portion 53a of the metal interconnect 53 being adjacent to each other; and a portion 54b extending in the Y direction.

In the example of FIG. 9, a metal interconnect 55 (MASK B) as the first interconnect supplying the voltage VSS includes: a portion 55a extending in the X direction and adjacent to the power supply interconnect VDD; a portion 55b extending in the X direction and adjacent to the power supply interconnect VSS; and a portion 55c extending in the Y direction and connecting the portion 55a and the portion 55b to each other. In the metal interconnect layer M1, the portion 55a is the interconnect closest to the power supply interconnect VDD, and the portion 55b is the interconnect closest to the power supply interconnect VSS. Furthermore, a metal interconnect 56 (MASK A) as the second interconnect supplying the voltage VDD includes: a portion 56a extending in the X direction and arranged on an opposite side of the portion 55a of the metal interconnect 55 from the power supply interconnect VDD, the portion 56a and the portion 55a of the metal interconnect 55 being adjacent to each other; and a portion 56b extending in the Y direction.

Adoption of the interconnect shape as shown in FIGS. 8 and 9 also makes it possible to appropriately perform exposure using two or more masks in the double patterning and to further reduce the intervals between metal interconnects. This feature enables a capacitor cell having a large capacitance value per unit area.

In this embodiment, the metal interconnect 51 supplying the voltage VSS is provided adjacent to the power supply interconnects VDD and VSS. Alternatively, the metal interconnect 52 supplying the voltage VDD may be provided adjacent to the power supply interconnects VDD and VSS.

Moreover, in the capacitor cell of the present embodiment, the fixed value outputter 202 may be omitted. In this case, the gate of the finFET included in the capacitor 201 may be directly connected to the power supply interconnects VDD and VSS using a metal interconnect.

Other Examples of Three-Dimensional Transistor Devices

In each of the above embodiments, the finFET has been described as examples. Alternately, a three-dimensional transistor device other than the finFET, for example, a nanowire FET, may be used.

Figure 11:
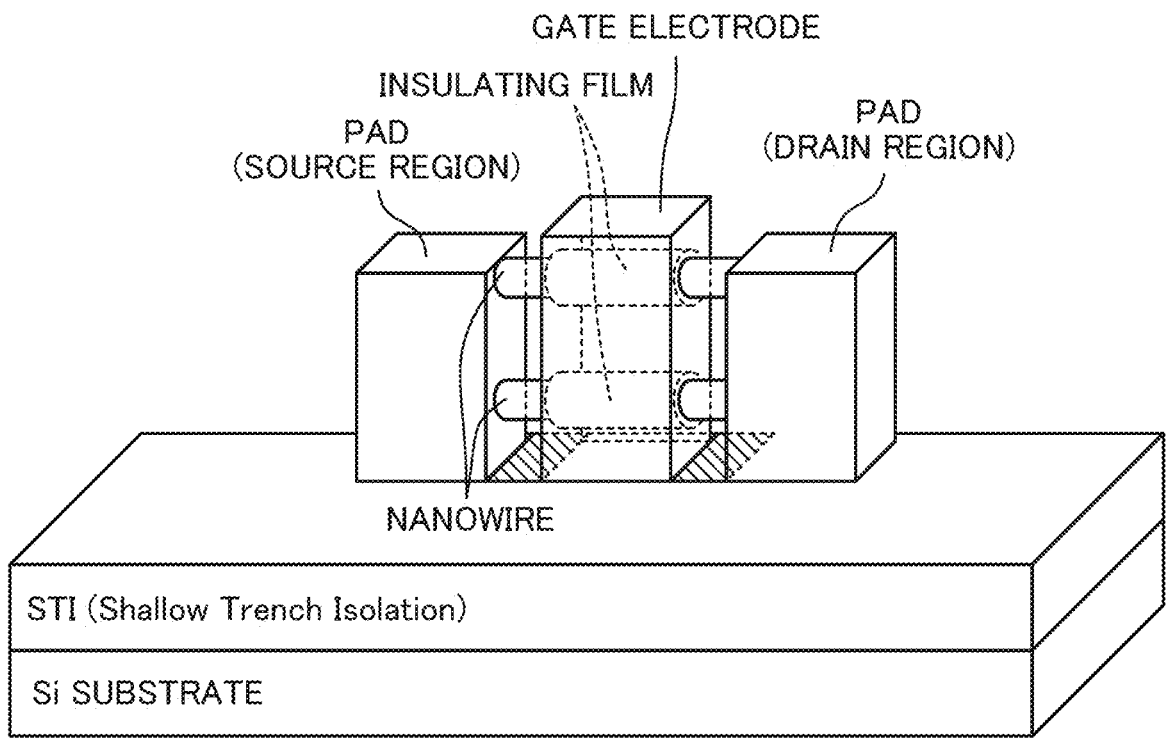
FIG. 11 is a schematic diagram showing a general structure of a nanowire FET.

FIG. 11 is a schematic diagram showing an example of a basic structure of a nanowire FET (also referred to as a gate all around (GAA) structure). A nanowire FET is an FET including a thin wire (a nanowire) conducting a current. The nanowire may be made of, for example, silicon. As shown in FIG. 11, a nanowire is arranged above a substrate so as to extend horizontally; that is, in parallel with the substrate, and both ends of the nanowire are connected to structures each of which functions as a source region or a drain region of the nanowire FET. In the present specification, structures each connected to either end of a nanowire of a nanowire FET and functioning as the source region or the drain region of the nanowire FET are referred to as pads. In FIG. 11, a shallow trench isolation (STI) is formed on the silicon substrate; however, portions (hatched portions), of the silicon substrate, located under the nanowire are exposed. In practice, the hatched portions may be covered with, for example, a thermal oxide film. In FIG. 11, for simplification, the thermal oxide film is not shown.

The periphery of the nanowires are surrounded by a gate electrode made of, for example, polysilicon via an insulating film such as a silicon oxide film. The pads and the gate electrode are formed on the surface of the silicon substrate. With this structure, the gate electrode surrounds all of the upper portion, both side portions, and the lower portion of the channel region of the nanowire, such that an electric field is uniformly applied to the channel region. Such a feature results in good switching characteristics of the FET.

Note that, in a pad, while at least a portion connected to a nanowire functions as a source/drain region, a portion under the portion connected to the nanowire does not necessarily function as the source/drain region. In some cases, a portion of the nanowire (a portion not surrounded by the gate electrode) can function as a source/drain region.

In addition, in FIG. 11, two nanowires are arranged in a vertical direction; that is, in a direction perpendicular to the substrate. Note that the number of nanowires to be arranged in the vertical direction is not limited to two. Alternatively, one nanowire or three or more nanowires may be arranged in the vertical direction. In addition, in FIG. 11, the upper end of the uppermost nanowire and the upper ends of the pads are located at the same height. However, these upper ends do not have to be at the same height. Thus, the upper ends of the pads may be located above the upper end of the uppermost nanowire.

Figure 12:
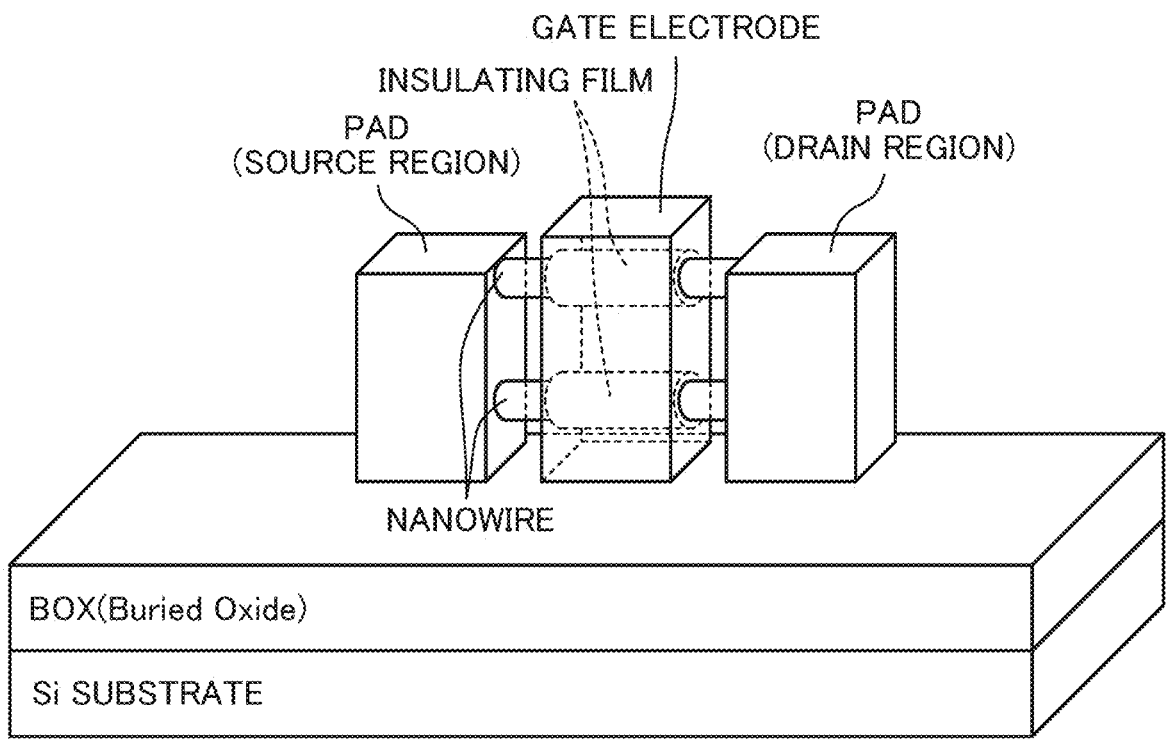
FIG. 12 is a schematic diagram showing a general structure of a nanowire FET.

As shown in FIG. 12, in some cases, a buried oxide (BOX) is formed on the upper surface of the substrate, and a nanowire FET is formed on this BOX.

In the above embodiment, when the semiconductor integrated circuit device is configured to include a nanowire FET instead of a finFET, one nanowire or multiple nanowires arranged in a direction perpendicular to the substrate and pads connected to both ends of the nanowire(s) correspond to a fin of the finFET. For example, each of the two fins 21 in the standard cell 2 shown in FIG. 1 is replaced with a structure in which pads and one nanowire extending in the X direction or multiple nanowires extending in the X direction and arranged in a direction perpendicular to the substrate are alternately connected to each other. In other words, in the configuration using the nanowire FET, the nanowires and the pads each connected to either end of the nanowire correspond to the three-dimensional diffusion layer. Then, local interconnects are connected to the pads in the structure corresponding to the three-dimensional diffusion layer.

Note that the elements in two or more of the embodiments may be combined with each other in any given manner within the scope of the present disclosure.

In a semiconductor integrated circuit device using a three-dimensional transistor device, the present disclosure makes it possible to implement a capacitor cell having a large capacitance value per unit area. Therefore, the present disclosure is useful for improving the performance of the semiconductor integrated circuit device.

What is claimed is:

1. A semiconductor integrated circuit device comprising:
   a standard cell which is a capacitor cell, wherein
   the standard cell includes:
      a first power supply interconnect extending in a first direction and supplying a first power supply voltage;
      a second power supply interconnect extending in the first direction and supplying a second power supply voltage;
      a capacitor provided between the first power supply interconnect and the second power supply interconnect, and including a three-dimensional transistor device;
      a first interconnect supplying the second power supply voltage; and
      a second interconnect supplying the first power supply voltage,
   the first and second power supply interconnects are provided in a first metal interconnect layer,
   the first interconnect includes:
      a first portion extending in the first direction and adjacent to the first power supply interconnect, the first portion being an interconnect closest to the first power supply interconnect in the first metal interconnect layer;
      a second portion extending in the first direction and adjacent to the second power supply interconnect, the second portion being an interconnect closest to the second power supply interconnect in the first metal interconnect layer; and
      a third portion extending in a second direction perpendicular to the first direction.

2. The semiconductor integrated circuit device of claim 1, wherein
   the second interconnect includes:
      a fourth portion extending in the second direction.

3. The semiconductor integrated circuit device of claim 2, wherein
   the second interconnect further includes:
      a fifth portion extending in the first direction and connected to the fourth portion.

4. The semiconductor integrated circuit device of claim 1, wherein
   an interval between the first portion of the first interconnect and the first power supply interconnect, and an interval between the second portion of the first interconnect and the second power supply interconnect are equal to each other.

5. The semiconductor integrated circuit device of claim 1, wherein
   the three-dimensional transistor device is a fin field effect transistor (finFET) or a nanowire FET.

* * * * *